United States Patent
Hack (10) Patent No.: US 11,222,928 B2
(45) Date of Patent: Jan. 11, 2022

(54) DISPLAY ARCHITECTURE WITH REDUCED NUMBER OF DATA LINE CONNECTIONS

(71) Applicant: Universal Display Corporation, Ewing, NJ (US)

(72) Inventor: Michael Hack, Carmel, CA (US)

(73) Assignee: Universal Display Corporation, Ewing, NJ (US)

(*) Notice: Subject to any disclaimer, the term of this patent is extended or adjusted under 35 U.S.C. 154(b) by 0 days.

(21) Appl. No.: 16/826,541

(22) Filed: Mar. 23, 2020

(65) Prior Publication Data

US 2020/0312922 A1 Oct. 1, 2020

Related U.S. Application Data

(60) Provisional application No. 62/827,301, filed on Apr. 1, 2019.

(51) Int. Cl.
| | | |
|---|---|---|
| G09G 3/32 | (2016.01) | |
| H01L 27/32 | (2006.01) | |
| H01L 51/50 | (2006.01) | |

(52) U.S. Cl.
CPC ...... *H01L 27/3218* (2013.01); *H01L 27/3276* (2013.01); *H01L 51/502* (2013.01); *H01L 2251/5338* (2013.01)

(58) Field of Classification Search
CPC .. G09G 3/32; G09G 3/30; G09G 3/34; G09G 3/36; G09G 5/00; G06F 3/038
See application file for complete search history.

(56) References Cited

U.S. PATENT DOCUMENTS

| | | | |
|---|---|---|---|
| 4,769,292 | A | 9/1988 | Tang |
| 5,247,190 | A | 9/1993 | Friend |
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |

(Continued)

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo et al. Highly efficient phosphorescent emission from organic electroluminescent devices, Nature, vol. 395, pp. 151-154, 1998.

(Continued)

*Primary Examiner* — Pegeman Karimi
(74) *Attorney, Agent, or Firm* — Butzel Long (57) ABSTRACT

Pixel arrangements for full-color displays are provided in which the number of data lines per pixel is less than the number of colors of sub-pixels within each pixel. RGB1B2-type arrangements are provided in which activation of one blue sub-pixel deactivates or prevents activation of the other.

18 Claims, 6 Drawing Sheets

(56) References Cited

U.S. PATENT DOCUMENTS

| | | |
|---|---|---|
| 7,431,968 B1 | 10/2008 | Shtein |
| 7,968,146 B2 | 6/2011 | Wagner |
| 9,385,167 B2 | 7/2016 | Hack |
| 9,385,168 B2 | 7/2016 | Hack |
| 9,424,772 B2 | 8/2016 | Hack |
| 9,559,151 B2 | 1/2017 | Hack |
| 9,590,017 B2 | 3/2017 | Hack |
| 10,177,201 B2 | 1/2019 | Hack |
| 10,192,936 B1 | 1/2019 | Hack |
| 10,229,956 B2 | 3/2019 | Hack |
| 10,243,023 B2 | 3/2019 | Hack |
| 10,304,906 B2 | 5/2019 | Hack |
| 10,374,017 B2 | 8/2019 | Hack |
| 10,580,832 B2 | 3/2020 | Hack |
| 2003/0230980 A1 | 12/2003 | Forrest |
| 2004/0174116 A1 | 9/2004 | Lu |
| 2006/0186822 A1* | 8/2006 | Park ............... G09G 3/3233 315/169.3 |
| 2010/0225252 A1 | 9/2010 | Weaver |
| 2011/0127506 A1* | 6/2011 | So ................. H01L 27/3213 257/40 |
| 2015/0009194 A1* | 1/2015 | Kim ............... G09G 3/3233 345/211 |
| 2015/0332628 A1* | 11/2015 | Ren ............... G09G 3/2003 345/690 |
| 2015/0349032 A1 | 12/2015 | Hack |
| 2015/0349034 A1* | 12/2015 | Hack ............. H01L 27/3213 257/40 |
| 2017/0229663 A1 | 8/2017 | Tsai |
| 2017/0278904 A1* | 9/2017 | Park ............... H01L 27/3218 |
| 2019/0035861 A1* | 1/2019 | Wang ............. H01L 27/32 |
| 2019/0206333 A1* | 7/2019 | Kim ............... H01L 51/5228 |
| 2020/0035761 A1 | 1/2020 | Hack |
| 2020/0265777 A1* | 8/2020 | Shigeta ............ G09G 3/2011 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

DISPLAY ARCHITECTURE WITH REDUCED NUMBER OF DATA LINE CONNECTIONS

CROSS-REFERENCE TO RELATED APPLICATIONS

This application is a non-provisional of, and claims the priority benefit of U.S. Provisional Patent Application Ser. No. 62/827,301, filed Apr. 1, 2019, the entire contents of which are incorporated herein by reference.

FIELD

The present invention relates to structures and components suitable for use in organic light emitting diodes (OLEDs) and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

As used herein, a "red" sub-pixel, layer, material, region, or device refers to one that emits light in the range of about 580-700 nm; a "green" sub-pixel layer, material, region, or device refers to one that has an emission spectrum with a peak wavelength in the range of about 500-600 nm; a "blue" sub-pixel layer, material, or device refers to one that has an emission spectrum with a peak wavelength in the range of about 400-500 nm; and a "yellow" sub-pixel, layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-475 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general there are two classes of color altering layers: color filters that modify a spectrum by removing unwanted wavelengths of light, and color changing layers that convert photons of higher energy to lower energy.

As used herein, a "full-color" device, pixel, or other component refers to one that includes red, green, and blue components, and which is capable of being configured to emit a range of light across the visible spectrum. A "full-color" device may include multiple sub-pixels, each of which may be configured to emit one or more colors of light. For example, a full-color pixel may include one or more red, green, blue, and/or yellow sub-pixels, each of which emits the corresponding light. For example, a red sub-pixel may emit red light as previously defined, which, in conjunction with the other sub-pixels, allows the pixel to be a full-color pixel. Full-color pixels or other components typically also may be capable of emitting white light, such as by activating multiple colors of sub-pixels concurrently. In some cases, a full-color pixel also may include a white or other multi-color sub-pixel or similar component.

In contrast to a full-color device, pixel, or other component, a "single-color" sub-pixel or other component does not include multiple components of different colors and typically emits light only within a single color range. For example, a red single-color sub-pixel typically emits light within the red visible spectrum, i.e., 580-700 nm. A single-color sub-pixel will emit all, or essentially all, visible light emitted by the sub-pixel within the associated spectrum range. That is, while a very small amount of energy emitted by a single-color sub-pixel within the visible spectrum may fall outside the associated color range, it will be a sufficiently small amount that the difference in color is not noticeable to the human eye.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
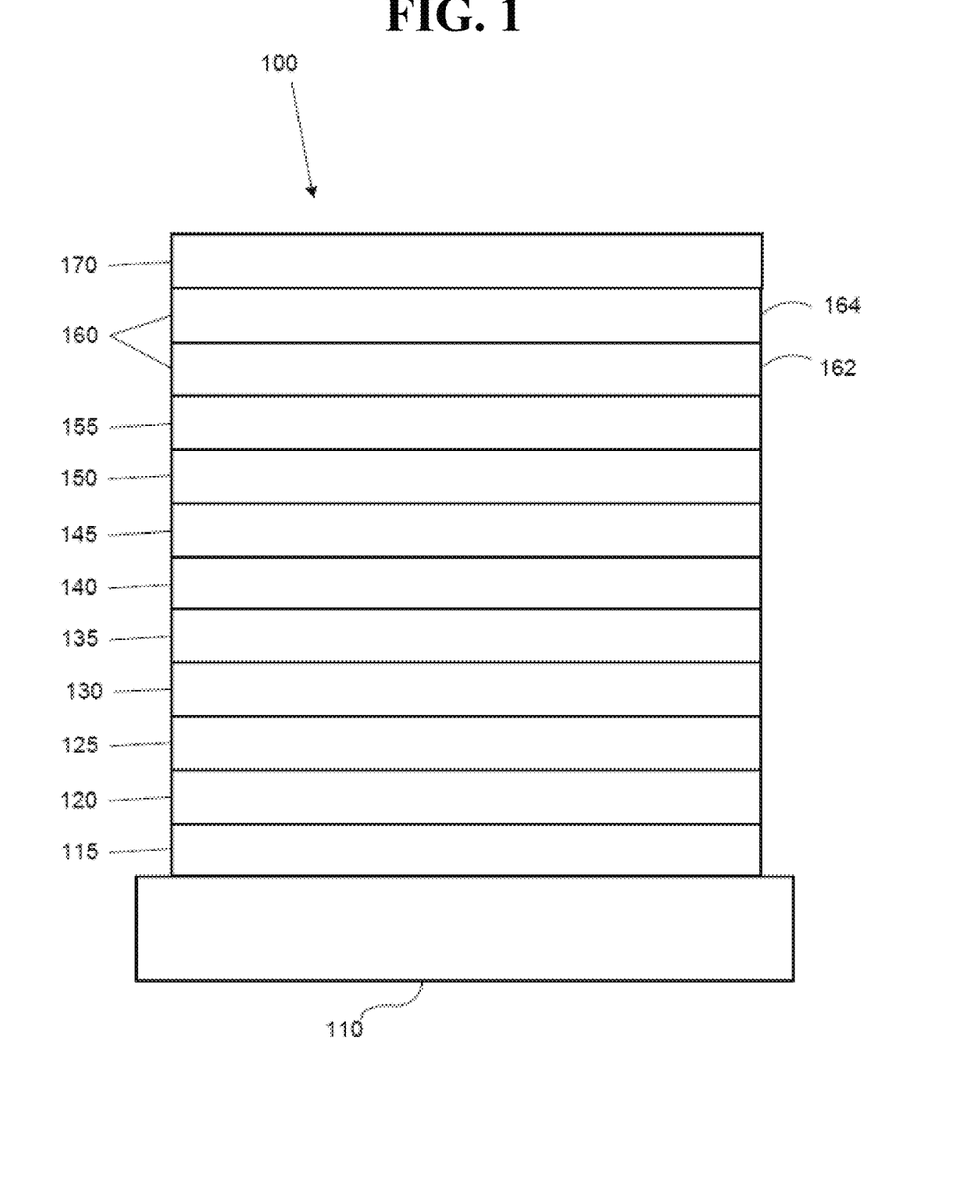
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat.

Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
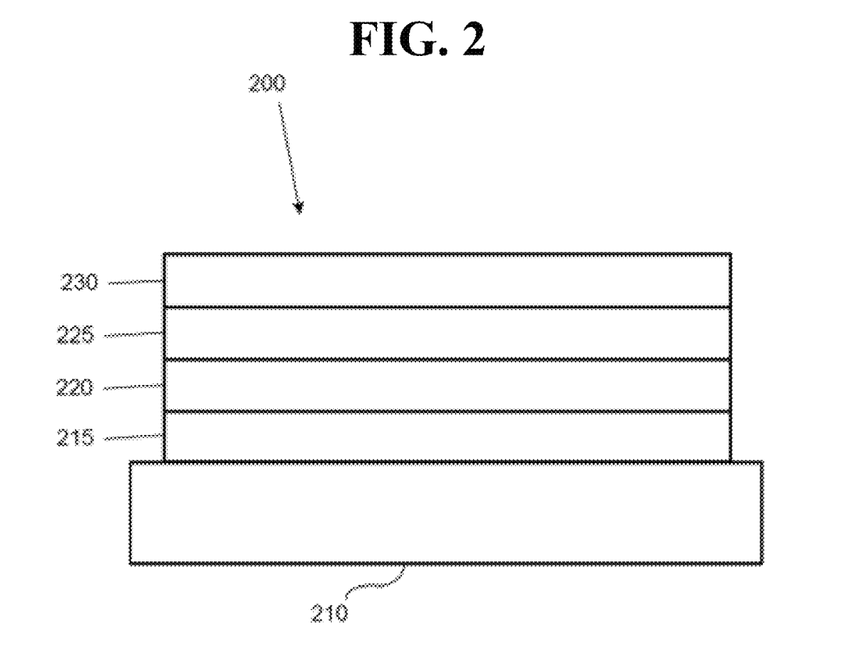
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

OLED devices as disclosed herein often are incorporated into other devices, such as display panels, portable electronics, and the like. Such devices typically include an array of full-color pixels, each of which is formed by a set of sub-pixels. It has been found that there are benefits to using pixel arrangements in which each pixel uses two single-color blue sub-pixels, light blue and deep blue, which may be referred to as a RGB1B2 or B1B2 architecture. For example, an architecture that includes light and deep blue sub-pixels may be used to enable a longer-lifetime phosphorescent light blue sub-pixel to be used in a display instead of, or in conjunction with deep blue sub-pixels, which typically have a lower average lifetime, thereby improving the efficiency of the device. Most images have little or no deep blue color content, so the light blue sub-pixel can be used to render any blue color in a displayed image other than images where a deep blue is explicitly required. It has also been found that the use of a B1B2 pixel arrangement may have health benefits due to a reduced amount of deep blue light emission.

Unfortunately many B1B2 architectures used in the past came with increased cost and complexity of the layout and drive circuitry, making it more costly to implement than a conventional RGB display. In contrast, embodiments disclosed herein provide methods and devices that implement B1B2-type OLED displays that may use only 3 OLED depositions, have little or no reduction in sub-pixel fill factors, and/or no more data or scan lines than would be required for a conventional RGB display, while achieving an improved lifetime with reduced manufacturing cost and complexity. Embodiments disclosed herein may achieve these improved results, for example, because at any given time all pixels may use either a deep blue or a light blue color, but the device may be restricted such that both blue colors are never used at the same time in the same pixel.

Figure 3A:
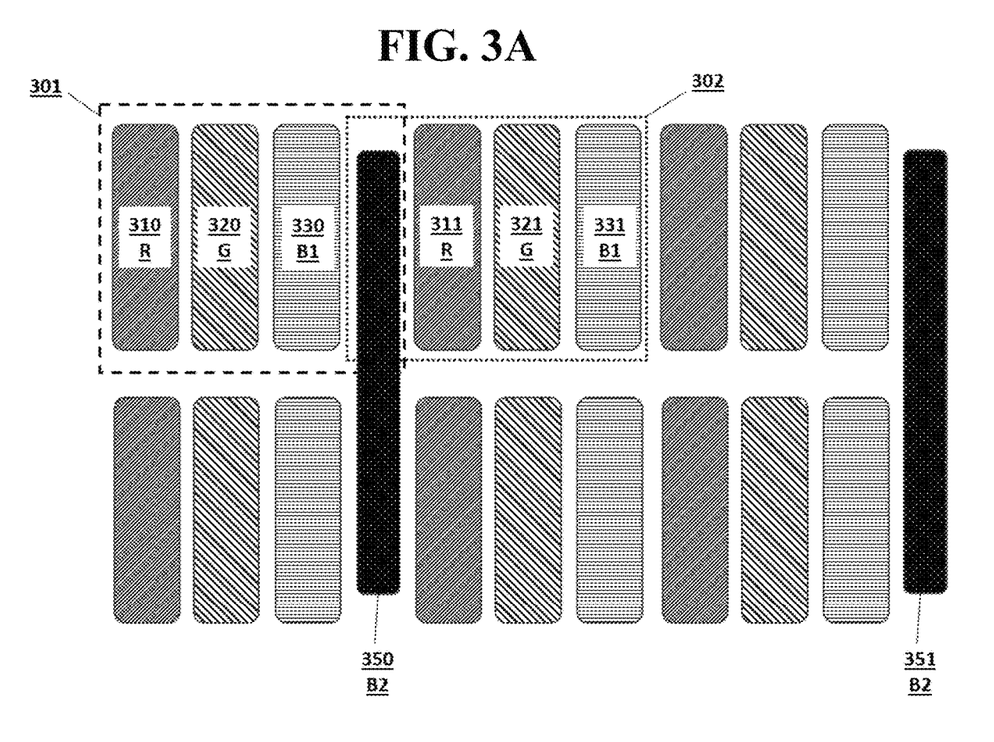
FIGS. 3A and 3B show pixel and sub-pixel arrangements according to embodiments disclosed herein.

FIG. 3A shows an example layout of a layout for a RGB1B2 display according to embodiments disclosed herein, where each deep blue (B2) sub-pixel may be shared by four pixels. The arrangement includes multiple full-color pixels such as pixels 301, 302. Full-color pixel 301 includes single-color sub-pixels 310, 320, 330, which emit red, green, and light blue, respectively, and 350, which emits deep blue. An adjacent pixel 302 includes a similar arrangement of single-color sub-pixels 311, 321, 332, 350. Notably, the deep blue sub-pixel 350 is "shared" by both pixels 301, 302 as well as two pixels shown below the pixels 301, 302. As used herein, a single sub-pixel may be "shared" among multiple full-color pixels when it is physically and electrically arranged such that it can be used by one, some, or all of the pixels that share it to generate the color(s) as indicated by a data signal that drives each of the multiple pixels. In this arrangement, each deep blue sub-pixel 350, 351 may be shared by up to four full-color pixels as shown. Sharing deep blue sub-pixels by more than one pixel allows for a smaller increase in the number of data lines needed to support a four sub-pixel per pixel architecture compared to conventional architectures, and also allows the deep blue sub-pixel to have a larger fill-factor, thereby improving its lifetime. This deep blue sub-pixel sharing is facilitated by the human eye only having a lower spatial resolution to deep blue than other colors. That is, it may be especially advantageous to use arrangements that allow for deep blue sub-pixel sharing compared to other colors because any resulting potential change may be less visible to the human eye and, in some cases, may be entirely undetectable.

Figure 3B:
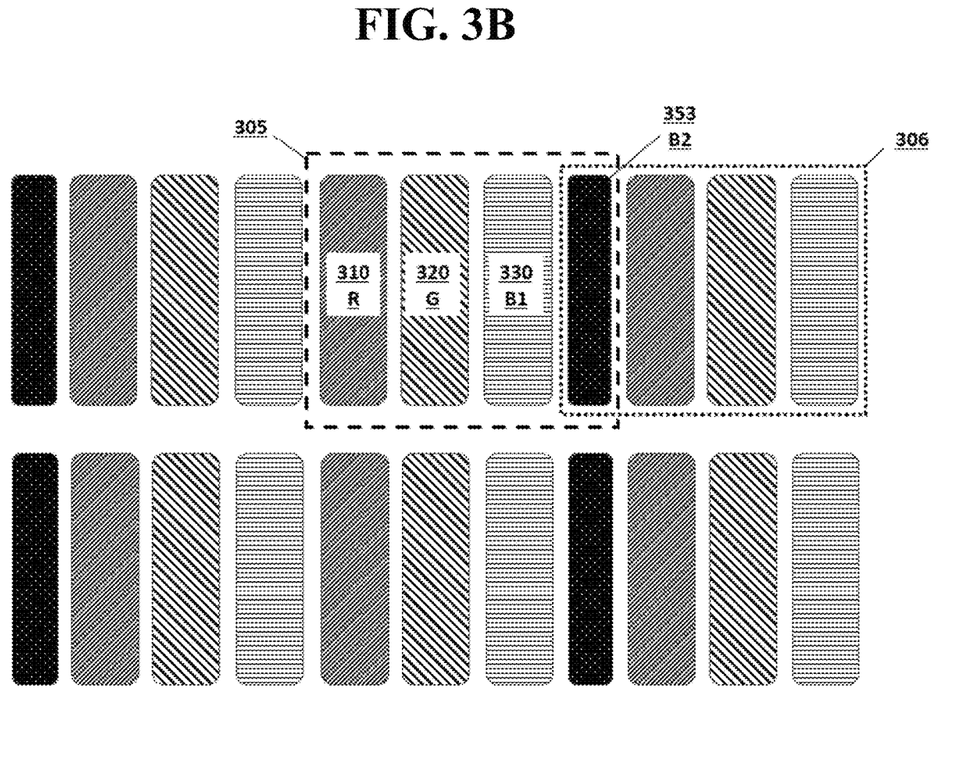

FIG. 3A shows an embodiment in which a deep blue sub-pixel may be shared by up to four pixels. Other embodiments may be used. For example, FIG. 3B shows a similar arrangement in which each deep blue sub-pixel 353 is shared among two adjacent full-color pixels 305, 306. Each pixel 305, 306 also includes red, green, and light blue sub-pixels 310, 320, 330 as previously disclosed. In arrangements such as shown in FIGS. 3A and 3B, the sub-pixel pattern may be repeated across any number of rows and columns or other repeated arrangements to achieve a desired panel size.

Figure 4:
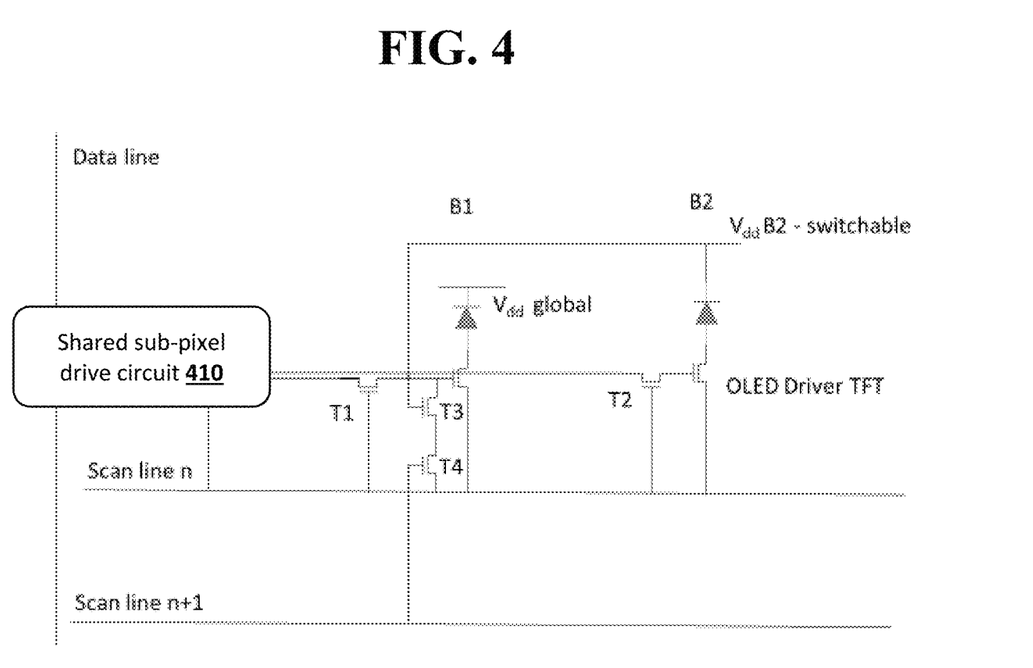
FIG. 4 shows a schematic view of a drive circuit according to embodiments disclosed herein.

As previously noted, embodiments disclosed herein may allow for efficient fabrication and use of B1B2-type architectures by using control circuits that require a relatively low number of data lines, and/or which prevent both blue sub-pixels from being activated concurrently. FIG. 4 shows an example control circuit for driving two blue sub-pixels in an RGB1B2 device according to an embodiment. In this arrangement, only a single data line and a single sub-pixel driving circuit is used for both the B1 and B2 sub-pixels. This allows for activation of one blue sub-pixel, such as the deep blue B2 sub-pixel, to deactivate or prevent activation of the other, such as the light blue B1 sub-pixel. In this example, the B2 Vdd line is switchable such that when the B2 sub-pixel is energized, the B1 sub-pixel is switched to an inactive state. This arrangement may use an additional switched (frame rate) power supply line for B1 that will be enabled when any pixel connected to that line needs the specific color provided by the B2 deep blue sub-pixel—"deep blue data line"—which may be evaluated frame by frame.

A single sub-pixel drive circuit 410 may be shared by the B1 and B2 OLEDs, i.e., the circuit 410 may control each of the B1 and B2 sub-pixels depending upon which is active. During use of such a control circuit, the deep blue B2 sub-pixel may be activated when it is required based upon the color data provided on the single data line to achieve a specified blue color. As previously described, this deactivates the light blue B1 sub-pixel so that only one blue sub-pixel is active at any time. The light blue B1 sub-pixel is activated for any blue emission needed by the full-color pixel or pixels of which the B1 and B2 sub-pixels are a part that does not require the specific emission provided by the deep blue B2 sub-pixel. A light blue sub-pixel may be used in conjunction with one or more color-altering components to achieve a wider range of blue emission, further decreasing the need for activation of the deep blue sub-pixel. Examples of suitable color altering components include color filters, color altering layers, up-conversion layers, down-conversion layers, and the like, including quantum dot layers, microcavities, doped organic layers, and the like. Such color-altering layers also may be used in conjunction with one or more other sub-pixels in a display, such as to increase the color range of a particular sub-pixel.

The sub-pixel driving circuit 410 may be, for example, a simple thin film transistor (TFT) which has a source line connected to the data line, the gate line connected to the scan line, and the drain line connected to transistors T1 and T2 as shown. In embodiments that employ pixel compensation, this driving circuit would may be a multi-TFT driving circuit. In this case T1 and T2 represent pass transistors that isolate the gates of the two driver TFTs so that when the light blue sub-pixel B1 driver TFT is turned off by activating Vdd of the deep blue B2 sub-pixel, it does not also turn off the driver TFT for the B2 sub-pixel. T3 and T4 connect the gate and source of the B1 driver TFT when Vdd B2 is activated, thereby shutting off the B1 sub-pixel when the B2 sub-pixel is energized. This connection of the B1 driver TFT gate to source can only occur after the sub-pixel driving circuit has placed the appropriate grey scale drive signal on the gate of the B2 driver TFT. This may be enabled by using the subsequent scan line voltage to activate the T3 and T4 path. This ensures that turning off B1 does not impact B2. Other arrangements may be used to reduce the number of data lines needed in comparison to the number of colors of sub-pixels in the pixel, and other components of the control circuitry may be the same as used in RGB1B2 arrangements or other B1B2-type architectures, including other control circuitry and scan line arrangements. That is, embodiments disclosed herein may not require any change in the scan line driver from a conventional arrangement, so such implementations may use standard data and scan line drivers and may only require additional switched power supplies for Vdd as shown.

Figure 5:
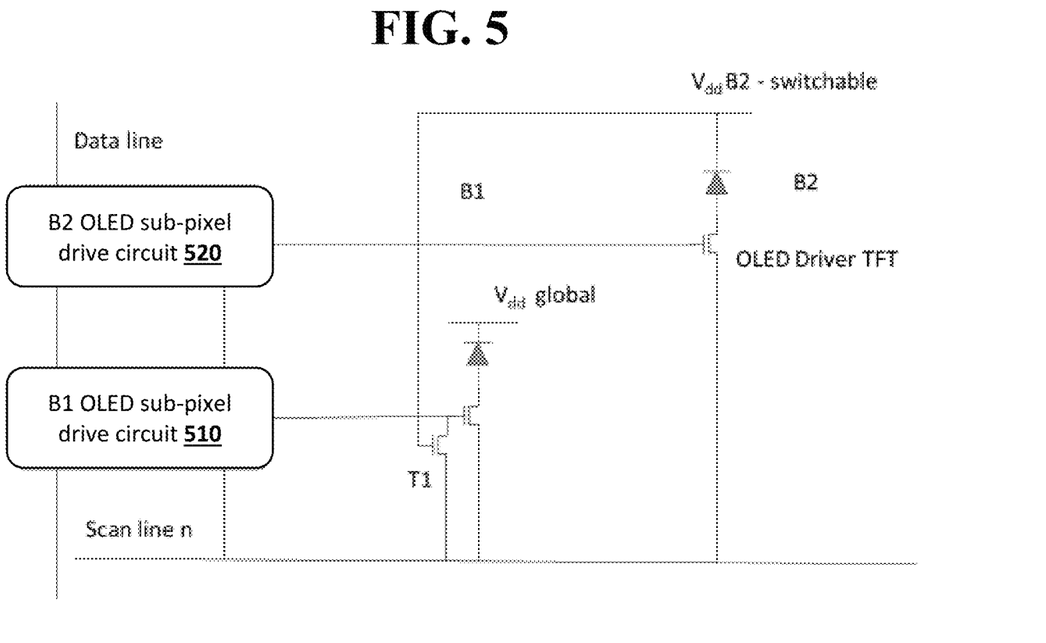
FIG. 5 shows a schematic view of a drive circuit according to embodiments disclosed herein

In other arrangements, separate driving circuits may be used for each sub-pixel even where only a single data line is used. FIG. 5 shows an example circuit arrangement that includes separate sub-pixel driving circuits. In this arrangement, a first sub-pixel drive circuit 510 drives the light blue B1 sub-pixel, and a second separate sub-pixel drive circuit 520 drives the deep blue B2 sub-pixel. Similarly to the arrangement shown in FIG. 4, a single data line is used for both blue sub-pixels and when the deep blue B2 sub-pixel is active, the light blue B1 sub-pixel is deactivated or prevented from activation. For example, the B2 Vdd may be switchable such that when the B2 sub-pixel is energized, the B1 sub-pixel is turned off or prevented from activating. As previously disclosed, each sub-pixel driving circuit 510, 520 may be a simple TFT with its source connected to the data line, its gate connected to the scan line, and its drain connected to the gate of an OLED driver TFT. If pixel compensation is employed, then the driving circuit may be a multi-TFT driving circuit. In this example, T1 connects the gate and source of the B1 driver TFT when Vdd B2 is activated, thereby shutting off the B1 sub-pixel when the B2 sub-pixel is energized.

Regardless of whether individual or shared driving circuits are used, the switchable data line (B2 Vdd in the examples of FIGS. 4-5) may be controlled externally on the basis of each line being switched based on image content, in the cases where one or more sub-pixels connected to each line needs to display a deep blue B2 color. That is, the data line drive voltage or current may be set to render a desired sub-pixel luminance. An external controller may be used to ensure that sub-pixel intensity information transmitted by the data line is applied to the B1 or B2 sub-pixel depending which is needed at any particular time, with Vdd adjusted accordingly as described herein. The switchable voltage lines in a display panel as disclosed herein may be switched individually, or they may be switched in groups of 2 lines, 4 lines or any number of lines simultaneously. The trade off to the number of lines to be switched at the same time (i.e., the block size of the display arrangement) provides a tradeoff between increased use of deep blue sub-pixels on one hand, compared to the number and resolution of additional switchable B2 power lines on the other. It may be desirable to select a number of simultaneously-switched lines that matches a desired frequency of use of the deep blue B2 sub-pixels during operation of the display panel.

It can be seen by considering extension of the example circuits shown in FIGS. 4 and 5 to a larger panel arrangement that devices disclosed herein may include fewer data lines per pixel than the number of colors of single-color sub-pixels within each full-color pixel. This may be the case even where multiple sub-pixels of a single color are used, such as where each full-color pixel includes multiple green, red, or yellow sub-pixels that may be activated in unison, for example. As a specific example, in the arrangement shown in FIG. 3A, each full-color pixel includes four colors of single-color sub-pixels—green, red, light blue, and deep blue. When used with a control circuit as shown in FIGS. 4-5, only three data lines may be needed since the light blue and deep blue sub-pixels share a single data line. That is, each full-color pixel in such a display would have four colors of sub-pixels but fewer than four data lines. The same general relationship holds where multiple sub-pixels of each color are used. For example, a similar arrangement having two deep blue sub-pixels in each pixel would still only use three data lines according to embodiments disclosed herein, since the light blue sub-pixel and the multiple deep blue sub-pixels within each pixel would use a single common data line.

In some embodiments, RGB data signals may be used to drive the pixel arrangements disclosed herein by adjusting the signal based on which blue sub-pixel is being used. That is, the RGB-type signal may be adjusted to account for a pixel formed from red, green, and light blue sub-pixels (an RGB1 pixel) or red, green, and deep blue (an RGB2 pixel). As previously noted, one type of pixel may be a "default" that is used unless the other is specifically needed, such as where an RGB1 pixel is used unless deep blue is needed, in which case an RGB2 pixel is used. Such mapping typically can be carried out in a graphics processing unit (GPU) or equivalent component of a display or a device providing video data to the display. Generally, in the embodiments disclosed herein each pixel will render a specific color, using either RGB1 sub-pixels when the specified color does not require B2, or RGB2 if it does require a deep or saturated blue. Individual RGB components may be calculated in real time for each pixel for each image.

One possible drawback or challenge of using a limited number of data lines and/or only activating deep blue sub-pixels in limited cases may appear to be a reduction in available color space, visible color quality, or similar. However, sub-pixel rendering allows for use of one deep blue sub-pixel for every 4, 8, or 16 full-color pixels for most OLED displays because the human eye has a much lower resolution for deep blue light than other colors. Accordingly, sub-pixel and pixel arrangements such as those shown in FIGS. 3A and 3B may be used. In such arrangements, even though the display panel is a "four color display," the red, green and light blue fill factors can be the same or almost the same as they would be in a three-color RGB display. This is especially the case if there are only three OLED emissive layer (EML) depositions, for red, green and light blue, so that the same OLED EML deposition is being used for light blue and deep blue as this ensures that there does not need to be a masking alignment tolerance between the light blue and deep blue pixels, further improving their fill factor or aperture ratios. For example, a color altering component may be used in conjunction with a light blue emissive deposition to achieve deep blue emission. Examples of color altering components include color filters, color altering layers, up-conversion layers, down-conversion layers, and the like, including quantum dot layers, microcavities, doped organic layers, and the like, which are arranged in a stack with the appropriate portion of the light blue EML deposition. In this case the light blue and deep blue sub-pixels only need to be separated by an alignment tolerance in the backplane and not an OLED patterning alignment tolerance.

Although the examples provided above describe the use of a light blue sub-pixel in all cases unless a deep blue color is required, other arrangements may be used. For example, a similar display may be configured to use a deep blue sub-pixel unless a light (less- or unsaturated) blue is required to generate the desired color, in which case the deep blue sub-pixel may be deactivated and the light blue sub-pixel activated. Similar control circuitry may be used to the arrangements shown in FIGS. 4 and 5, where the light blue B1 sub-pixel includes a switched power line that turns off or disables the deep blue B2 sub-pixel when energized. Thus, in the case of a deep blue data line, all the pixels on that data line will render color based on the deep blue B2 sub-pixel, whereas in the case of a light blue data line, all the pixels on the data line will render color based on the light blue B1 sub-pixel. In either case, only one of the B1 or B2 sub-pixels is used at any given time in any given pixel, determined by whether any image for a given pixel connected to the same Vdd B2 line requires a deep blue sub-pixel or not. More generally, two sub-pixels of the same or a similar color may be used, where only one is active within a given pixel at a time. As another example, two red sub-pixels may be used, with one providing a deeper red than the other, i.e., a deeper peak emission wavelength. Such a configuration may be used where a highly saturated red emission is desired in some cases. The deep red sub-pixel may be relatively inefficient, in which case the lighter red sub-pixel may be used in cases where the specific deep red emission is not needed. This allows for improved overall display efficiency while still providing a deeper color saturation than otherwise may be possible.

Embodiments disclosed herein also may be used with other pixel arrangement types in addition to RGB1B2 architectures, which may include more or fewer sub-pixels in each pixel. For example, RGYB1B2 (red, green, yellow, light blue, deep blue) pixel arrangements may use similar arrangements in which fewer data lines per pixel are used than the number of colors of sub-pixels in each pixel. As a specific example, for an RGYB1B2 pixel that includes single red, green, yellow, light blue, and deep blue single-color sub-pixels, four or fewer data lines may be used. Such a configuration may include separate data lines for the red, green, and/or yellow sub-pixels, while using the same architecture for the B1 and B2 pixels as previously disclosed. Examples of RGYB1B2 and other pixel arrangements and associated devices and circuitry that may be suitable for use with the systems and methods disclosed herein are described, for example, in U.S. Pat. Nos. 9,385,168, 9,590, 017, 9,424,772, 10,243,023, 10,304,906, and 10,229,956 and U.S. Pub. Nos. 2015/0349034 and 2015/0349032, the disclosure of each of which is incorporated by reference in its entirety.

Notably, embodiments disclosed herein may reduce, minimize, or eliminate the cost and complexity effects of using four or more sub-pixels in each full-color pixel within a display panel, while still providing the benefits typically associated with arrangements that use four or more sub-pixels. For example, as previously disclosed, pixel arrangements as disclosed herein may be fabricated by depositing not more than three separate emissive material layers or other deposition arrangements. This reduces the fabrication time, cost, and complexity of the device relative to other techniques for fabricating devices having four or more sub-pixels per pixel. Furthermore, sub-pixel rendering techniques may be used to reduce the effective reduction in fill factor that is typically expected when using four or more sub-pixels per pixel. As another example, the use of fewer data and/or gate lines per pixel relative to other arrangements that use four or more sub-pixels may provide cost, time, and complexity savings as well. As previously described, embodiments disclosed herein may allow for RGB1B2 type displays that have improved lifetime while using the same data and scan line architecture as used in a conventional RGB display.

Although examples provided herein are described with respect to OLED sub-pixels, such as shown in FIGS. 1-2, the same architectures may be used for other types of sub-pixels, including but not limited to microLED and quantum dot sub-pixels. That is, the architectures, arrangements, and devices described herein do not rely on any particular type of sub-pixel or emissive material to achieve the benefits described, but may be used with any device type that can be fabricated and connected in the manner shown and described. Such devices may be useful, for example, due to the desire to reduce deep blue emission generally for health reasons such as eye strain or injury, sleep cycle disturbance, and the like.

Furthermore, embodiments disclosed herein may apply equally to any emissive display that can benefit from using two different color blue sub-pixels, in addition to the OLED display panels shown and described herein. Such techniques may be useful to improve display health impacts by reducing deep blue emissions, and may improve display lifetime and/or efficiency by reducing the use of the deep blue sub-pixels. Examples of other suitable devices include microLED displays including mobile and television type displays, whether using a side by side architecture, or based on the downconversion of unpatterned blue and/or blue/green OLEDs or other emissive devices to produce a full color RGB image.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

I claim:

1. A full-color display device comprising:
    a display panel comprising:
        a plurality of full-color pixels, each of the plurality of full-color pixels comprising at least four colors of single-color sub-pixels, including a light blue sub-pixel and a deep blue sub-pixel; and
        a plurality of data lines, each data line providing display information to at least one sub-pixel;
    wherein the number of data lines per pixel in the display panel is less than the number of colors of single-color sub-pixels within each of the plurality of full-color pixels, and
    wherein each pixel of the plurality of pixels always prevents the light blue sub-pixel and the deep blue sub-pixel from being used concurrently by the each pixel.

2. The display device of claim 1, wherein at least some of the sub-pixels comprise an organic emissive material.

3. The display device of claim 1, wherein at least some of the sub-pixels comprise a quantum dot architecture.

4. The display device of claim 1, wherein at least some of the sub-pixels comprise microLEDs.

5. The display device of claim 1, wherein each full-color pixel comprises four colors of sub-pixels and there are fewer than four data lines per pixel in the display panel.

6. The display device of claim 1, wherein each deep blue sub-pixel is shared by at least two full-color pixels.

7. The display device of claim 6, wherein each deep blue sub-pixel is shared by at least four full-color pixels.

8. The display device of claim 1, further comprising driving circuitry capable of being configured to activate only one of the light blue sub-pixel and the deep blue sub-pixel at a time.

9. The display device of claim 1, wherein the light blue sub-pixel and the deep blue sub-pixel are electrically connected to a single data line.

10. The display device of claim 9, wherein the light blue sub-pixel and the deep-blue sub-pixel are driven by a common sub-pixel driving circuit.

11. The display device of claim 9, wherein each of the light blue sub-pixel and the deep-blue sub-pixel are driven by separate sub-pixel driving circuit.

12. The display device of claim 11, wherein the display panel comprises not more than 3 colors of organic emissive depositions.

13. The display device of claim 1, further comprising a color-altering component in each pixel that converts light emitted by the light blue sub-pixel to deep blue.

14. The display device of claim 1, wherein each of the light blue sub-pixel and the deep blue sub-pixel is electrically connected to a separate power supply line from the other.

15. The display device of claim 14, wherein the power supply line for one of the light blue and deep blue sub-pixels is configured to activate a circuit that disables the other.

16. The display device of claim 1, wherein the sub-pixels comprise a green sub-pixel and a red sub-pixel.

17. The display device of claim 1, wherein the device comprises a device type selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a mobile phone, a tablet, a phablet, a personal digital assistant (PDA), a wearable device, a laptop computer, a digital camera, a camcorder, a viewfinder, a micro-display having an active area with a primary diagonal of 2 inches or less, a 3-D display, a virtual reality or augmented reality display, a vehicle, a video wall comprising multiple displays tiled together, a theater or stadium screen, and a sign.

18. A pixel structure for a full-color display, the pixel structure comprising sub-pixels of at least four colors including a light blue sub-pixel and a deep blue sub-pixel, wherein the pixel structure comprises electrical connections for a number of data lines per pixel that is less than the number of sub-pixels in the pixel structure and the pixel structure always prevents the light blue sub-pixel and the deep blue sub-pixel from being used concurrently.

* * * * *